United States Patent
Hoefler et al.

(10) Patent No.: US 10,127,998 B2
(45) Date of Patent: Nov. 13, 2018

(54) MEMORY HAVING ONE TIME PROGRAMMABLE (OTP) ELEMENTS AND A METHOD OF PROGRAMMING THE MEMORY

(71) Applicants: Alexander B. Hoefler, Austin, TX (US); Thomas E. Tkacik, Phoenix, AZ (US)

(72) Inventors: Alexander B. Hoefler, Austin, TX (US); Thomas E. Tkacik, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 81 days.

(21) Appl. No.: 14/038,401

(22) Filed: Sep. 26, 2013

(65) Prior Publication Data

US 2015/0085557 A1    Mar. 26, 2015

(51) Int. Cl.
| | | |
|---|---|---|
| G11C 29/00 | (2006.01) | |
| G11C 17/16 | (2006.01) | |
| G11C 17/18 | (2006.01) | |
| G11C 7/24  | (2006.01) | |

(52) U.S. Cl.
CPC ............. *G11C 29/70* (2013.01); *G11C 7/24* (2013.01); *G11C 17/16* (2013.01); *G11C 17/18* (2013.01); *G11C 29/787* (2013.01)

(58) Field of Classification Search
CPC ..................................................... G11C 29/70
USPC ......................................................... 365/148
See application file for complete search history.

(56) References Cited

U.S. PATENT DOCUMENTS

| | | | | |
|---|---|---|---|---|
| 5,708,291 | A | * | 1/1998 | Bohr .................... H01L 23/5256 257/529 |
| 5,852,580 | A | * | 12/1998 | Ha ........................ G11C 29/789 365/200 |
| 6,608,792 | B2 | | 8/2003 | Pitts |
| 7,046,569 | B2 | * | 5/2006 | Ito et al. ........................ 365/225 |
| 7,550,789 | B2 | | 6/2009 | Bonaccio et al. |
| 8,030,181 | B2 | | 10/2011 | Chung et al. |
| 8,369,166 | B2 | * | 2/2013 | Kurjanowicz ....... G06F 11/1048 365/200 |
| 8,380,768 | B2 | | 2/2013 | Hoefler |
| 8,468,419 | B2 | * | 6/2013 | Dudeck et al. ............... 714/763 |

(Continued)

FOREIGN PATENT DOCUMENTS

CA         2878742 A1 *  7/2015  ............. G11C 29/70

OTHER PUBLICATIONS

Sedra/ Smith, Microelectronic Circuits, Sixth edition, published Dec. 15, 2009. Table of Contents and Chapter 5. 140 pages.*

*Primary Examiner* — Anthan Tran
*Assistant Examiner* — Mushfique Siddique (57) ABSTRACT

A method of programming a memory includes selecting a logic state for programming a first bitcell of the memory. A first one-time-programmable (OTP) element of the first bitcell is programmed using a first set of conditions intended to achieve a first target resistance in accordance with the selected logic state which results in a first degree of programming of the first OTP element. A second OTP element of the first bitcell is programmed using a second set of conditions different from the first set of conditions intended to achieve a second target resistance in accordance with the selected logic state which results in a second degree of programming of the second OTP element, wherein the first and second degrees of programming are visually indistinguishable.

18 Claims, 4 Drawing Sheets

(56) References Cited

U.S. PATENT DOCUMENTS

| | | | | |
|---|---|---|---|---|
| 8,913,444 B1* | 12/2014 | Gilbert | G11C 11/56 | 365/148 |
| 2001/0037478 A1* | 11/2001 | Kim | G11C 17/18 | 714/710 |
| 2003/0076714 A1* | 4/2003 | Suzuki | G11C 7/24 | 365/200 |
| 2003/0123314 A1* | 7/2003 | Buer | G11C 17/16 | 365/225.7 |
| 2004/0066670 A1* | 4/2004 | DeShazo | G11C 16/0441 | 365/185.28 |
| 2004/0261049 A1* | 12/2004 | Mohr | G11C 17/18 | 714/710 |
| 2005/0105366 A1* | 5/2005 | Pedlow, Jr. | G11C 17/18 | 365/225.7 |
| 2007/0183181 A1* | 8/2007 | Peng | G11C 17/18 | 365/96 |
| 2008/0101146 A1* | 5/2008 | Paak | G11C 17/18 | 365/225.7 |
| 2008/0143373 A1* | 6/2008 | Bonaccio | G06F 21/6245 | 326/8 |
| 2008/0180983 A1* | 7/2008 | Vollrath | G11C 17/14 | 365/96 |
| 2009/0059645 A1* | 3/2009 | Schmitt | G11C 17/18 | 365/96 |
| 2009/0141577 A1* | 6/2009 | Chu | G11C 17/165 | 365/225.7 |
| 2010/0198896 A1* | 8/2010 | Hoefler | | 708/250 |
| 2010/0202183 A1* | 8/2010 | Kurjanowicz | G11C 17/16 | 365/94 |
| 2011/0013469 A1* | 1/2011 | Park | G11C 17/16 | 365/200 |
| 2012/0194222 A1* | 8/2012 | Hoefler | G11C 7/04 | 327/57 |
| 2012/0297257 A1* | 11/2012 | Mohr | G11C 17/18 | 714/710 |
| 2013/0286710 A1* | 10/2013 | Hall | G11C 17/16 | 365/96 |
| 2014/0215294 A1* | 7/2014 | Kim | G11C 17/02 | 714/819 |
| 2015/0287480 A1* | 10/2015 | Wilson | G11C 29/70 | 365/96 |
| 2015/0294736 A1* | 10/2015 | Shim | G11C 29/1201 | 365/96 |
| 2016/0055920 A1* | 2/2016 | Lee | G11C 17/18 | 365/96 |

* cited by examiner

| | A_set_b | B_set_b | B_read | A_read | Prog |
|---|---|---|---|---|---|
| Program A | 0 | 1 | 0 | 0 | 1 |
| Program B | 1 | 0 | 0 | 0 | 1 |
| read | 0 | 1 | 0 | 1 | 0 |
| read_b | 1 | 0 | 1 | 0 | 0 |

MEMORY HAVING ONE TIME PROGRAMMABLE (OTP) ELEMENTS AND A METHOD OF PROGRAMMING THE MEMORY

BACKGROUND

Field

This disclosure relates generally to memories, and more specifically, to a memory having one time programmable (OTP) elements and a method of programming the memory.

Related Art

Secure values, such as security keys, are typically stored in one time programmable (OTP) elements such as electrical fuses. However, programmed and unprogrammed electrical fuses can be distinguished easily using relatively simple analysis, such as by using Scanning Electron Microscopy (SEM) analysis. Therefore, there is a risk that security keys, or other secure values, stored in electronic fuses can be reverse-engineered.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, a bitcell includes a first OTP element and a second OTP element, in which, once programmed, the difference in resistance between the first and second OTP elements determine the logic state of the bitcell. This difference in resistance between the first and second OTP may be achieved by using a different set of programming conditions in programming each of the first and second OTP elements. For example, a first set of conditions may be used to program the first OTP element which results in a first degree of programming, and a second set of conditions, different from the first, may be used to program the second OTP element which results in a second degree of programming. The degree of programming is, for example, the extent of change in an electrical characteristic, such as resistance, in an OTP element due to its being programmed.

In one embodiment, the different degrees of programming result in different resistances of the OTP elements. If the first OTP element of a bitcell has a resistance that exceeds a resistance of the second OTP element of a bitcell by a sufficient margin, a first logic state is stored in the bitcell. However, if the resistance of the second OTP element exceeds the resistance of the first OTP element by a sufficient margin, a second logic state, different from the first logic state, is stored in the bitcell. Although, after programming, each of the first and second OTP elements can be visually determined to have been programmed, their degrees of programming are visually indistinguishable. That is, after programming, it is not possible to visually determine which of the first and second OTP element has a greater degree of programming, e.g., a greater resistance value, and therefore, it is not possible to visually determine the logic state stored in the bitcell. In this manner, improved security of the values stored in the bitcells may be achieved.

The terms "assert" (or "set") and "negate" (or "deassert" or "clear") are used herein when referring to the rendering of a signal, status bit, or similar apparatus into its logically true and logically false state, respectively. If the logically true state is a logic level one, the logically false state is a logic level zero. And if the logically true state is a logic level zero, the logically false state is a logic level one. Each signal described herein may be designed as positive or negative logic, where negative logic can be indicated by a bar over the signal name, an asterix (*) following the name, or a "_b" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

In one embodiment, OTP elements are elements which may be programmed once and, once programmed, permanently remain in the programmed state. In one embodiment, an OTP element is characterized as having a first distribution of probable values for an electrical characteristic when unprogrammed and a second distribution of probable values for the electrical characteristic when programmed. The difference in the electrical characteristic determines when the OTP has a programmed state or an unprogrammed state. In one example, the electrical characteristic used to distinguish between the programmed and unprogrammed state is resistance. In this example, an OTP element may have a first resistance within a first distribution of probable resistance values prior to programming and a second and much higher resistance within a second distribution of probable resistance values upon programming. Therefore, in the descriptions herein, the distributions described relate to probable values of resistance. However, in alternate embodiments, different types of OTP elements may have different distributions for the programmed state and the unprogrammed states based on electrical characteristics other than resistance.

In one embodiment, an OTP element may include an electrically programmable fuse or an antifuse. One example of an electrically programmable fuse is a polysilicon-based fuse, which has a first resistance prior to programming and a second and much higher resistance upon programming. In one embodiment, the fuselink of a polysilicon-based fuse includes a polysilicon layer with an overlying silicide. Therefore, prior to programming, the fuselink has a low resistance. During programming, a current may be applied which is large enough to damage the fuselink (e.g. the silicide of the fuselink) to reduce conductivity, resulting in the higher resistance. The applied programming current may result in the higher resistance through various different mechanisms, such as, for example, electromigration or rupture. For example, with the mechanism of electromigration, the applied programming current may cause electromigration of metal atoms from the silicide which results in the higher, programmed resistance. In another example, with the mechanism of rupture, the applied programming current may cause rupture, i.e., a physical discontinuity, of the silicide which results in the higher, programmed resistance. Generally, OTP elements which are programmed by different mechanisms have different distributions of probable resistance values. For example, typically, OTP elements which are programmed by the rupture mechanism have distributions of higher probable resistance values as compared to those OTP elements which are programmed by the electromigration mechanism. Furthermore, as will be described in more detail below, OTP elements which are programmed by the same mechanism may have different distributions of probable resistance values based on programming conditions of the applied programming current.

Figure 1:
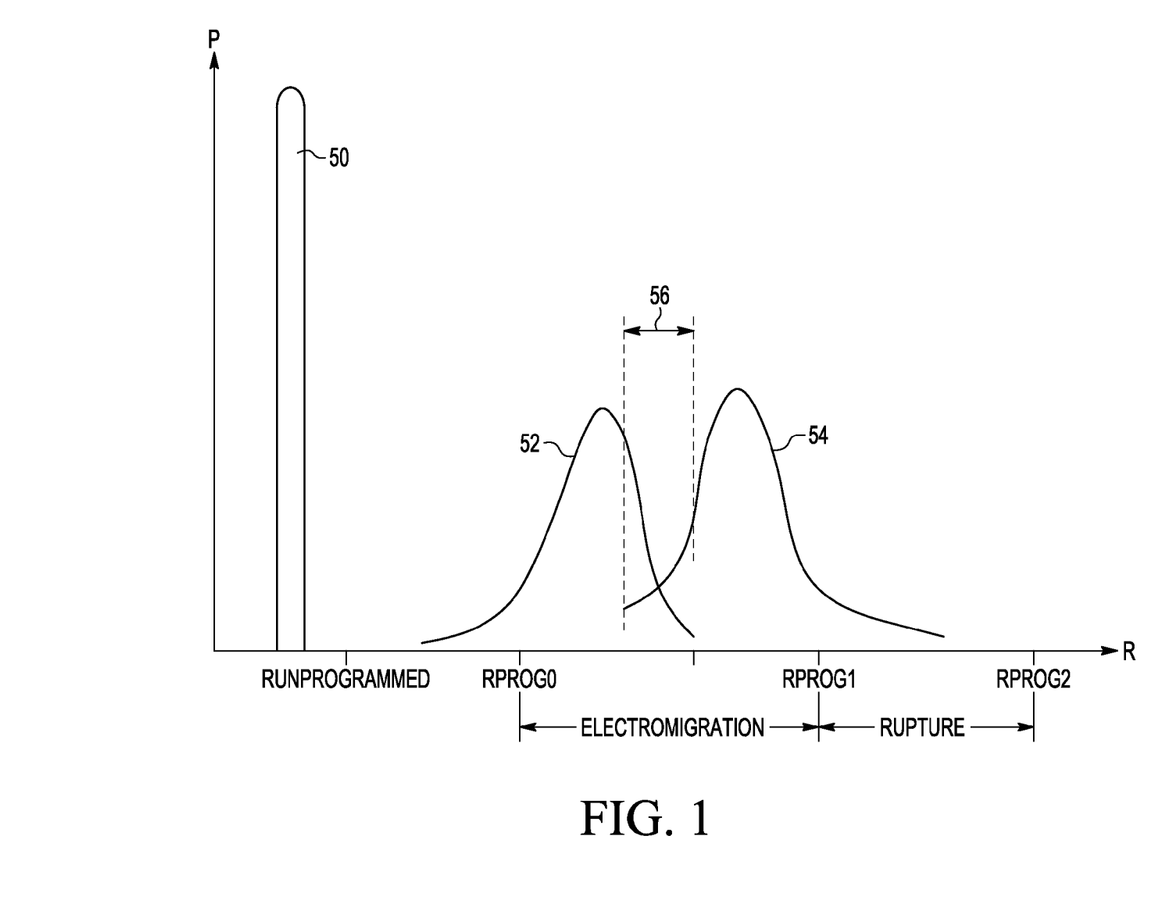
FIG. 1 illustrates example distributions of electrical characteristics corresponding to an OTP element.

For example, FIG. 1 illustrates sample distributions for probable resistance values for an electrically programmable polysilicon-based fuse. In FIG. 1, the y-axis denotes a probability density, and the x-axis denotes a resistance of OTP elements. FIG. 1 therefore illustrates a set of probability density distributions of resistances (which may simply be referred to as "distribution") of OTP elements. In particular, FIG. 1 includes an unprogrammed distribution 50 and programmed distributions 52 and 54. Distribution 50 provides a distribution of probable resistance values of the fuse prior to programming, and distributions 52 and 54 provide distributions of probable resistance values of the fuse after programming. Therefore, note that distribution 50 is a tighter distribution as compared to each of distributions 52 and 54. Also, the resistance values of distribution 50 are less than an unprogrammed resistance value, Runprogrammed, while the resistance values of distributions 52 and 54 (or of any programmed element) are at least greater than Runprogrammed. Therefore, when such a fuse is programmed, the value of its resistance is switched from a value within distribution 50 to a value within distribution 52 or 54, based on the applied programming conditions (e.g. current and programming time).

When programming an OTP element, an applied programming current can be selected to achieve a target programmed resistance within a particular resistance range. For example, to have a programmed distribution fall within the range of resistance values Rprog0 to Rprog1, the applied programming current is set to a value which likely causes the fuselink to be programmed by the electromigration mechanism. However, to have a programmed distribution fall within a higher range of resistance values, such as Rprog 1 to Rprog2, the applied programming current is set to a value which likely causes the fuselink to be programmed by the rupture mechanism. Note that within a same programming mechanism, such as electromigration, different applied programming currents may result in different distributions, such as programmed distributions 52 and 54. These different distributions still achieve a target resistance within Rprog0 and Rprog1. Therefore, a first programming current may result in an OTP element with a first degree of programming which falls within distribution 52, and second programming current, different from the first programming current, may result in an OTP element with a second degree of programming which falls within distribution 54. In these examples, the degree of programming refers to the resulting resistance of the OTP element after programming by applying the programming current. In one embodiment, the programming current can be set by programming conditions such as voltage and time in which a greater voltage and/or time may be selected in an attempt to achieve a greater degree of programming (e.g., in an attempt to achieve a greater programmed resistance).

Still referring to FIG. 1, distributions 52 and 54 overlap within an overlap region 56. If a resistance value of a first OTP element falls within distribution 52, outside of overlap region 56, and a resistance value of a second OTP element falls within distribution 54, outside of overlap region 56, then the second OTP element has a greater degree of programming, and thus greater resistance, than the first OTP element. However, due to the overlap of distributions 52 and 54, it is possible to have a programmed OTP element whose applied programming current targeted a resistance within distribution 52 actually have a greater resistance than a resistance value of a programmed OTP element whose applied programming current targeted a resistance within distribution 54. That is, a programmed OTP element within distribution 52 may have a greater degree of programming than a programmed OTP element within distribution 54, depending on where the OTP elements fall within overlap region 56.

Furthermore, while visual analysis, such as SEM analysis, may be used to distinguish between a programmed OTP element and an unprogrammed OTP element, or between two OTP elements which were programmed by different mechanisms (e.g. electromigration vs. rupture), visual analysis cannot distinguish the degree of programming of two OTP elements when both OTP elements are programmed by the same mechanism. For example, a programmed OTP element which falls within distribution 52 (and has a resulting resistance between Rprog0 and Rprog1) and a programmed OTP element which falls within distribution 54 (and has a resulting resistance between Rprog0 and Rprog1) are both programmed by electromigration. These two OTP elements can be visually determined to have been programmed, and to have been programmed due to electromigration, but their degrees of programming are not visually distinguishable from one another. Although these two OTP elements, under visual inspection, such as by SEM analysis, may physically look different from each other due to different details in their structural features resulting from electromigration, it is not possible to distinguish which has a greater degree of programming and thus which has a greater resistance. Similarly, if two OTP elements are programmed by rupture, it is possible to visually determine that they have been programmed, and that they have been programmed by rupture, but it would not be possible to distinguish, visually, which of the two OTP elements has a greater degree of programming and thus a greater resistance value. Therefore, as long as two OTP elements are programmed by a same mechanism, such as, for example, electromigration, the two OTP elements may be visually different from one another but their degrees of programming cannot be visually distinguished from one another.

Since different programming conditions may be used in an attempt to achieve different target resistances of an OTP element, a first and second OTP element may be used within a bitcell to store a desired logic state. The difference in resistance between the first and second OTP element may be used to determine the logic state stored in such a bitcell. For example, the first OTP element may be programmed under a first set of programming conditions to achieve a first target resistance and the second OTP element may be programmed under a second set of programming conditions, different from the first set, to achieve a second target resistance different than the first target resistance. In one example, the first OTP element having a resulting greater resistance than the second OTP element may indicate a first logic state, while the first OTP element having a resulting lower resistance than the second OTP element may indicate a second logic state.

Figure 2:
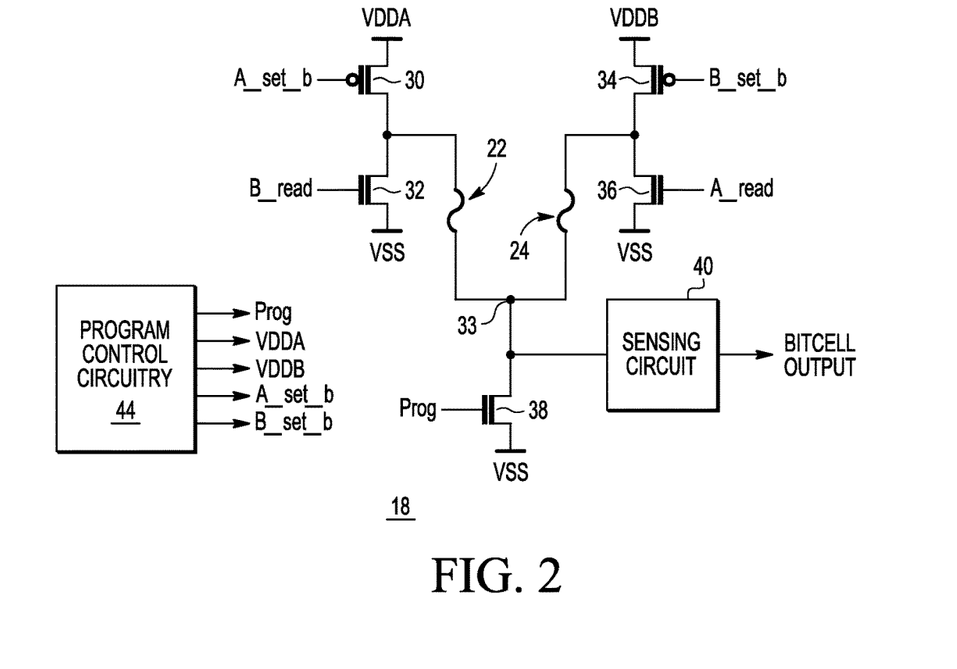
FIG. 2 illustrates, in partial block diagram form and partial schematic form, a bitcell with a sensing circuit and program control circuitry in accordance with an embodiment of the present invention.

FIG. 2 illustrates, in partial schematic and partial block diagram form, an example of a bitcell 18 which may be used to store a logic state. Bitcell 18 includes PMOS transistors 30 and 34, NMOS transistors 32, 36, and 38, OTP element A 22, OTP element B 24, sensing circuit 40, and program control circuitry 44. A first current electrode of transistor 30 is coupled to a first supply voltage, VDDA, a control electrode of transistor 30 is coupled to receive a signal A_set_b, and a second current electrode of transistor 30 is coupled to a first current electrode of transistor 32. A control electrode of transistor 32 is coupled to receive a signal B_read, and a second current electrode of transistor 32 is coupled to a second supply voltage, VSS. A first current electrode of transistor 34 is coupled to a third supply voltage, VDDB, a control electrode of transistor 34 is coupled to receive a signal B_set_b, and a second current electrode of transistor 34 is coupled to a first current electrode of transistor 36. A control electrode of transistor 36 is coupled to receive a signal A_read, and a second current electrode of transistor 36 is coupled to the second supply voltage, VSS. A first terminal of OTP element A 22 is coupled to the second current electrode of transistor 30 and a first terminal of OTP element B 24 is coupled to the second current electrode of transistor 34. Second terminals of OTP element A 22 and OTP element B 24 are coupled to a first current electrode of transistor 38 at a node 33. A control electrode of transistor 38 is coupled to receive a signal Prog, and a second current electrode of transistor 38 is coupled to the second supply voltage, VSS. Sensing circuit 40 is coupled to node 33 and provide a bitcell output which, when bitcell 18 is read, provides the logic state stored by bitcell 18.

FIG. 2 also includes program control circuitry 44 which provides VDDA and VDDB, and provides the signals Prog, A_set_b, and B_set_b, as needed, to program OTP elements A and B. In the illustrated embodiment of FIG. 2, each of OTP element A 22 and OTP element B 24 is an electrically programmable fuse. In this embodiment, when each of these OTP elements switches from an unprogrammed state to a programmed state, their resistance value changes from a value within an unprogrammed distribution (such as distribution 46 of FIG. 4) to a value within a programmed distribution. For example, OTP element A may switch from a value within unprogrammed distribution 50 to a value within programmed distribution 52 or 54, and OTP element B may switch from a value within unprogrammed distribution 50 to a value within programmed distribution 52 or 54, depending on the logic state to be stored within bitcell 18. In an alternate embodiment, each of OTP element A 22 and OTP element B 24 can be antifuses, metal fuses, or other OTP elements.

In operation, the resistances of OTP elements A and B determine the logic state stored in bitcell 18, in which, during a read, sensing circuit 40, based on the difference in resistances of OTP elements A and B, senses the logic state stored in bitcell 18 and outputs that state as the bitcell output. In the illustrated embodiment, it is assumed that if OTP element A has a higher resistance than OTP element B by a sufficient margin so as to be sensed as such by sensing circuit 40, then bitcell 18 stores a first logic state, and if OTP element A has a lower resistance than OTP element B by a sufficient margin so as to be sensed as such by sensing circuit 40, then bitcell 18 stores a second logic state, different from the first logic state.

OTP element A is programmed by turning on transistors 30 and 38 and turning off transistors 32, 34, and 36. This results in coupling VDDA to the first terminal of OTP element A, causing a large programming current to flow down through OTP element A 22. In this manner, OTP element A is switched from its unprogrammed state to its programmed state. The values of VDDA and the time that A_set_b is asserted, as controlled by program control circuitry 44, determines the programming current which flows through OTP element A. This results in a degree of programming of OTP element A, i.e. in a programmed resistance. The values of VDDA and the time duration of A_set_b may be set to values which attempt to achieve a first target resistance. Similarly, OTP element B 24 is programmed by turning on transistor 34 and 38 and turning off transistors 32, 30, and 36. This results in coupling VDDB to the first terminal of OTP element B, causing a large programming current to flow down through OTP element B. In this manner, OTP element B is switched from its unprogrammed state to its programmed state. The values of VDDB and the time that B_set_b is asserted, as controlled by program control circuitry 44, determines the programming current which flows through OTP element B. This results in a degree of programming of OTP element B, i.e. in a programmed resistance. The values of VDDB and the time duration of B_set_b may be set to values which attempt to achieve a second target resistance. Note that OTP elements A and B can be programmed in any order.

In one embodiment, if it is desired that bitcell 18 store the first logic state, a first set of conditions may be used to program OTP element A to achieve a target resistance within distribution 54, and a second set of conditions may be used to program OTP element B to achieve a target resistance within distribution 52. The first set of conditions may refer to values provided by program control circuitry 44 for VDDA and A_set_b to appropriately set the voltage and time for programming, and the second set of conditions may refer to values provided by program control circuitry 44 for VDDB and B_set_b to appropriately set the voltage and time for programming.

In one embodiment, during sensing to determine the value of bitcell 18, OTP elements A and B serve as a voltage divider, where the voltage level between them, at a node 33, is detected by sensing circuit 40. In alternate embodiments, other types of sensing circuits may be used to detect the differential in resistance between OTP elements A and B.

Figure 3:
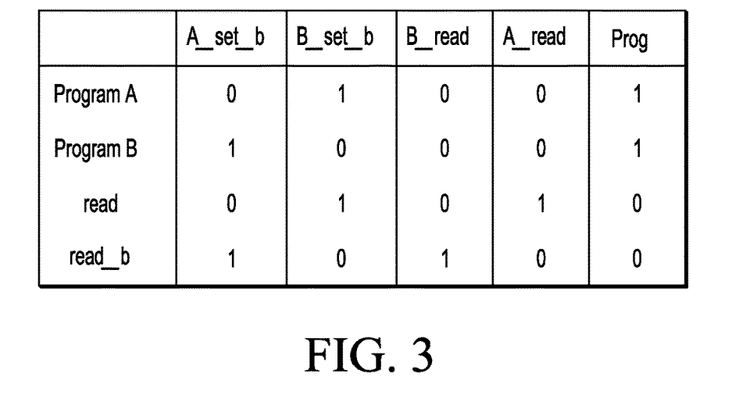
FIG. 3 illustrates a table which provides input values for various operations which can be performed on the bitcell of FIG. 2.

Operation of bitcell 18 of FIG. 2 will be described in further detail with reference to the table of FIG. 3. FIG. 3 illustrates a table of values for input signals A_set_b, B_set_b, B_read, A_read, and Prog to perform the following operations: program OTP element A (Program A), program OTP element B (Program B), read bitcell 18, and read_b bitcell 18. For example, to program OTP element A, the A_set_b and Prog signals are asserted to turn on transistors 30 and 38, as was described above, and B_set_b, B_read, and A_read are negated to turn off transistors 34, 32, and 36. Therefore, in the embodiment of FIG. 3, OTP element B is not programmed while OTP element A is being programmed. To program OTP element B, the B_set_b and Prog signals are asserted to turn on transistors 34 and 38, as was described above, and A_set_b, B_read, and A_read are negated to turn off transistors 30, 32, and 36.

Still referring to FIGS. 2 and 3, when a read operation is performed, a same read voltage, VDD, may be provided as both VDDA and VDDB. Also, A_set_b and A_read are asserted to turn on transistors 30 and 36, and B_set_b, B_read, and Prog are negated to turn off transistors 34, 32, and 38. Therefore, note that, in this embodiment, during a read operation, current flows from VDD through transistor 30, OTP element A 22, OTP element B 24, and down through transistor 36 to VSS. Therefore, the voltage at node 33 at the input of sensing circuit 40 is a fraction of VDD, based on the resistances of OTP elements A and B. Therefore, based on which resistance is greater between OTP elements A and B, bitcell output will have different logic states.

When a read_b operation is performed, current flows in the opposite direction. That is, B_set_b and B_read are asserted to turn on transistors 34 and 32, and A_set_b, A_read, and Prog are negated to turn off transistors 30, 36, and 38. Therefore, during a read_b operation, current flows from VDD through transistor 34, OTP element B 24, OTP element A 22, and down through transistor 32 to VSS. As with the read operation described above, the voltage at node 33 at the input of sensing circuit 40 is a fraction of VDD, based on the resistances of OTP elements A and B. Therefore, based on which resistance is greater between OTP elements A and B, the bitcell output will have different logic states. However, during a read_b operation, the logic states of the bitcell output are opposite to what they would be during a read operation. This property can be used as a test feature to check if the logic state is stable. For a stable condition, the read and read_b operations should result in complementary logic states being presented at the bitcell output.

Note that FIG. 2 provides one example of a bitcell which includes OTP elements A and B which can be used to store a logic state. However, alternate embodiments, different bitcell configurations may be used in which the different sets of programming conditions may be used for each OTP element so as to result in different degrees of programming (i.e. resulting in different programmed resistances) in order to store a desired logic state.

Figure 4:
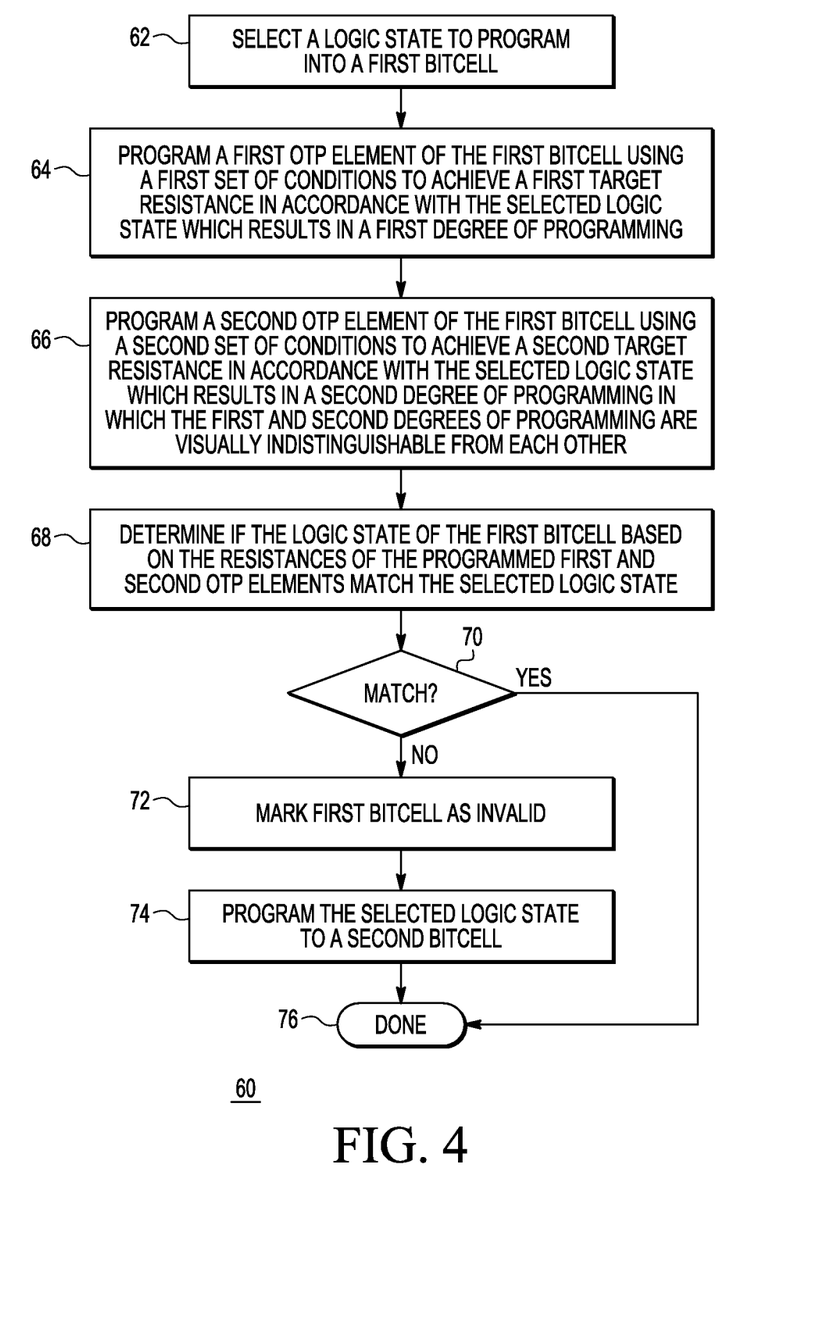
FIG. 4 illustrates, in flow diagram form, a method for programming a memory whose bitcells include OTP elements, in accordance with one embodiment of the present invention.

FIG. 4 illustrates a method 60 for programming a bitcell which includes a first and second OTP element. The method can apply, for example, to a bitcell configured like that of bitcell 18. Method 60 begins with block 62 in which a logic state is selected for programming into a first bitcell. This bitcell may be configured, for example, like bitcell 18. Method 60 proceeds to block 64 in which a first OTP element of the first bitcell is programmed using a first set of conditions to achieve a first target resistance in accordance with the selected logic state which results in a first degree of programming. For example, referring to bitcell 18 and the example distributions of FIG. 1, if the selected logic state is a first logic state in which OTP element A should result in higher programmed resistance than OTP element B, then the first set of conditions used for programming OTP element A may result in a programming current which attempts to achieve a first target resistance within distribution 54. Furthermore, this first target resistance is a resistance which is caused by a particular mechanism, such as electromigration.

Method 60 then proceeds to block 66 in which a second OTP element of the first bitcell is programmed using a second set of conditions, different from the first set of conditions (such as, e.g., different in voltage and/or programming time) to achieve a second target resistance in accordance with the selected logic state which results in a second degree or programming. For example, referring still to bitcell 18 and the example distributions of FIG. 1, if the selected logic state is the first logic state, then the second set of conditions used for programming OTP element B may result in a programming current which attempts to achieve a second target resistance within distribution 52. Furthermore, this second target resistance is also a resistance which is caused by the same particular mechanism as for the first target resistance, such as electromigration in this example. In this manner, the first and second degrees of programming are visually indistinguishable from each other.

As discussed above, if both the first and second OTP elements are both programmed to achieve a target resistance that is between Rprog0 and Rprog1 (which would be the case if both were programmed by the mechanism of electromigration), then while they could visually be observed as having a physical appearance indicative of being programmed by electromigration and thus having a resistance between Rprog0 and Rprog1, they could not be visually observed to identify which of the first and second OTP elements actually has a greater degree of programming (i.e. a greater resistance). That is, even with SEM analysis, it could not be determined if the first or second OTP has a greater resistance and thus the logic state of the bitcell cannot be ascertained visually.

However, note that due to overlap region 56, while the first set of conditions attempts to program the first OTP element to have a greater resistance than the second OTP element in order to store the selected first logic state, the result may actually be that the first OTP element has a lower resistance than the second OTP element. Since distributions 52 and 54 overlap, this is possible, though with small probability, based on where in the distribution the first and second OTP elements end up falling upon programming. In this situation, a wrong logic state (i.e. not the selected logic state) ends up stored in the first bitcell. In this case, this type of error can be addressed by various mechanisms such as, for example, redundancy and/or error correction.

Referring back to method 60 of FIG. 4, after programming the first and second OTP elements in accordance with the selected logic state, method 60 proceeds to block 68 in which it is determined (such as by sensing circuit 40) if the logic state of the first bitcell based on the resulting programmed resistances of the programmed first and second OTP elements match the selected logic state. Note that this determination of the logic state can be made under several different environmental conditions at which the circuit operates, e.g., multiple operating temperatures and voltages, to ensure robustness across typical operating conditions of the circuit. If, at decision diamond 70, the determined logic state matches the selected logic state, then programming of the first bitcell is successful and the method ends. However, if, at decision diamond 70, the determined logic state does not match the selected logic state, then programming of the first bitcell was not successful and method 60 proceeds to block 72 in which the first bitcell is marked as invalid. Method 60 then proceeds to block 74 in which the selected logic state is programmed to a second bitcell. Method 60 then ends. This second bitcell may therefore be referred to as a redundant bitcell which may, during a read operation, be accessed in place of the first bitcell. The second bitcell may be programmed in the same manner as described above in reference to blocks 64 and 66, using different programming conditions to achieve target resistances in accordance with the selected logic state.

Note that with both the first bitcell and the second (i.e. redundant) bitcell, programming of the first and second OTP elements in each bitcell causes a visible change in the resulting appearance or of the electrical characteristic. However, the resulting appearance from the programming does not indicate a degree of programming when the programming is within a range of programming. For example, so long as the programming of each of the first and second OTP elements of a bitcell (the first or redundant bitcell) are programmed with a same mechanism, such as electromigration, and thus fall within a target range of resistances, the resulting appearance does not indicate the comparative resistances between the first and second OTP elements. Therefore, so long as the set of programming conditions used to program the first and second OTP elements of a bitcell are within a predetermined range which result in a same mechanism for programming, the resulting resistances cannot be visually distinguished.

Figure 5:
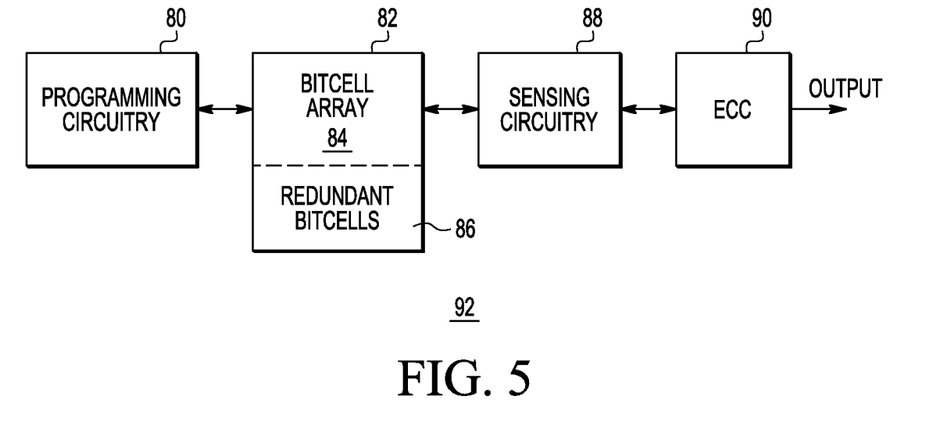
FIG. 5 illustrates, in block diagram form, a portion of a memory in accordance with one embodiment of the present invention.

FIG. 5 illustrates, in block diagram form, a memory 92 which includes programming circuitry 80, an OTP memory array 82, sensing circuitry 88, and error detection and correction (ECC) circuitry 90. OTP memory array 82 includes a bitcell array 84 and redundant bitcells 86. Each of the bitcells in memory array 82 may include a first and second OTP element, such as bitcell 18. Each bitcell in bitcell array 84 may be programmed as was described above in reference to FIG. 4, and, when the programming of a particular bitcell is not successful, a redundant bitcell in redundant bitcells 86 may be programmed. Therefore, during a read of bitcell array 84, if a bitcell is marked as invalid, a redundant bitcell of redundant bitcells 86 may be accessed instead. Programming circuitry 80 may be used to control the programming conditions of the bitcells in bitcell array 84 and redundant bitcells 86. For example, programming circuitry 80 may control the time duration of the programming currents as well as the voltage used, similar to as was described above in reference to program control circuitry 44 for bitcell 18. Programming circuitry 80 may also include circuitry which determines if a particular bitcell has been programmed to the selected logic state by determining if a resistance of the a first OTP element of the bitcell is greater than a resistance of a second OTP element of the bitcell. Programming circuitry 80 may also select a redundant bitcell and program a first and second OTP element of the selected redundant bitcell when the particular bitcell has not been correctly programmed to the selected logic state. In this case, programming circuitry 90 may replaced the selected bitcell with the redundant bitcell.

Sensing circuitry 88 may include any type of circuitry which, based on the differences in degrees of programming of the first and second OTP element of a bitcell, determine the logic state stored in the bitcell. That is, during a read mode, sensing circuitry 88 can perform reads of the memory array. If there are errors in bitcell array 84, ECC circuitry 90 may be used to provide error detection and correction to correct an output provided by sensing circuitry 88 in order to provide a correct output of OTP memory array 82. In one embodiment, ECC circuitry 90 provides correction when neither a bitcell nor a redundant bitcell has been properly programmed. In alternate embodiments, redundant bitcells 86 may not be present or ECC circuitry 90 may not be present in memory 92.

By now it should be appreciated that there has been provided a bitcell with first and second OTP elements which may be programmed in a manner which results in the logic state of the bitcell to not be visually discernable, such as by SEM analysis. This may allow for improved security of values stored within these bitcells. For example, so long as the first and second OTP elements are programmed by a same mechanism, but using a different set of programming conditions corresponding to different programmed distributions of probable resistance values with a target range of resistance values, the resulting degrees of programming of the programmed first and second OTP elements cannot be visually distinguished. Therefore, the resulting programmed logic state also cannot be visually determined.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, a bitcell with first and second OTP elements can be configured in a variety of different manners which store a logic state based on a difference in an electrical characteristic of the first and second OTP elements. Also, this electrical characteristic may be resistance or some other electrical characteristic. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of programming a memory, including selecting a logic state for programming a first bitcell of the memory; programming a first one-time-programmable (OTP) element of the first bitcell using a first set of conditions intended to achieve a first target resistance in accordance with the selected logic state which results in a first degree of programming of the first OTP element; and programming a second OTP element of the first bitcell using a second set of conditions different from the first set of conditions intended to achieve a second target resistance in accordance with the selected logic state which results in a second degree of programming of the second OTP element, wherein the first and second degrees of programming are visually indistinguishable. Item 2 includes the method of item 1 and further includes determining if the first bitcell has the selected logic state. Item 3 includes the method of item 2 wherein the determining includes determining if the first OTP element has a lower resistance than the second OTP element by a sufficient margin. Item 4 includes the method of item 2, if the first bitcell does not have the selected logic state, further including programming a redundant bitcell to the selected logic state; and replacing the first bitcell with the second bitcell. Item 5 includes the method of item 4, wherein the programming the redundant bitcell includes programming a first OTP element of the redundant bitcell using the first set of conditions which results in a third degree of programming; and programming a second OTP element of the redundant bitcell using the second set of conditions which results in a fourth degree of programming, wherein the third and fourth degrees of programming are visually indistinguishable. Item 6 includes the method of item 5, and further includes determining if the redundant bitcell has the selected logic state. Item 7 includes the method of item 6, wherein the determining if the redundant bitcell has the selected logic state comprises determining if the third OTP element has a lower resistance than the fourth OTP element by a sufficient margin. Item 8 includes the method of item 6, and further includes if the redundant bitcell does not have the selected logic state, using error correction coding during reading of the memory. Item 9 includes the method of item 1, wherein: the first set of conditions and the second set of conditions include programming time; the programming time is different between the first and second sets of conditions; and the first set of conditions and the second set of conditions are for causing electromigration. Item 10 includes the method of item 1, wherein the first set of conditions and the second set of conditions include programming voltage, wherein the programming voltage is different between the first and second sets of conditions.

Item 11 includes a memory including a bitcell array comprising a bitcell array of bitcells and a plurality of redundant bitcells, wherein: each bitcell comprises a first one-time-programmable (OTP) element and a second OTP element and each redundant bitcell comprises a third OTP element and a fourth OTP element; programming of the first, second, third, and fourth OTP elements causes a visible change with a resulting appearance; and the resulting appearance from the programming does not indicate a degree of programming if the programming is within a predetermined range of programming conditions; and programming circuitry coupled to the bitcell array that programs a selected bitcell to a selected state by programming the first OTP element of the selected bit cell using a first set of conditions that are within the predetermined range of programming when the first set of conditions corresponds to the selected state and by programming the second OTP element of the selected bit cell using a second set of conditions that are different from the first set of conditions and are within the predetermined range. Item 12 includes the memory of item 11, wherein the programming circuitry determines if the selected bit cell has been programmed to the selected state. Item 13 includes the memory of item 12, wherein the programming circuitry determines if the selected bit cell has been programmed to the selected state by determining if a resistance of the first OTP element of the selected bitcell is greater than a resistance of the second OTP element of the selected bitcell. Item 14 includes the memory of item 13, wherein, if the programming circuitry determines that the selected bitcell has not been programmed to the selected state, the programming circuitry programs a selected redundant bitcell by programming the third OTP element of the selected redundant bitcell using the first set of conditions and the fourth OTP element of the selected redundant bitcell using the second set of conditions. Item 15 includes the memory of item 14, wherein if the program circuitry determines that the redundant bitcell has the selected state, the program circuitry replaces the selected bitcell with the redundant bitcell. Item 16 includes the memory of item 15, and further includes sensing circuitry, coupled to the memory array, that performs reads of the memory array during a read mode; and error correction code circuitry coupled to the sensing circuitry that corrects an output that corresponds to the selected bitcell when the selected bitcell and the selected redundant bitcell have not been programmed to the selected state. Item 17 includes the memory of item 11, wherein the first set of conditions and the second set of conditions includes programming voltage and programming time, and the programming voltage in the first set of conditions is different than the programming voltage in the second set of conditions. Item 18 includes the memory of item 11, wherein the programming by the programming circuitry is by electromigration.

Item 19 includes a method of programming a memory having a plurality of bitcells, wherein each bitcell comprises a first one-time-programmable (OTP) element and a second OTP element, including determining a selected bitcell for programming; and programming the selected bitcell to a first logic state by applying a first set of conditions to the first OTP element of the selected bitcell to result in a first resistance in the first OTP element and applying a second set of conditions different from the first set of conditions to the second OTP element of the selected bitcell to result in a second resistance in the second OTP element greater than the first resistance, wherein: the first OTP element changes to a first visible appearance indicative of a resistance in a first range of resistance; the second OTP element changes to a second visible appearance indicative of a resistance in the first range; and a comparison of the first visible appearance and the second visible appearance cannot reliably identify which of the first and second OTP elements has the greater resistance. Item 20 includes the method of item 19, wherein programming causes electromigration to result in the first resistance, the second resistance, the first visible appearance, and the second visible appearance.

What is claimed is:

1. A method of programming a memory, comprising:
selecting one of two different logic states as a selected logic state for programming a first bitcell of the memory, wherein the first bitcell includes a first one-time-programmable (OTP) element and a second OTP element, and a logic state of the first bitcell is based on a difference between resistances of the first and second OTP element after providing a programming current through the first and second OTP elements;
programming a first one-time-programmable (OTP) element of the first bitcell using a first set of conditions to provide a first programming current through the first OTP element intended to achieve a first target resistance in accordance with the selected logic state which results in a first degree of programming of the first OTP element;
programming a second OTP element of the first bitcell using a second set of conditions different from the first set of conditions to provide a second programming current through the second OTP element intended to achieve a second target resistance in accordance with the selected logic state which results in a second degree of programming of the second OTP element, wherein the first and second degrees of programming are visually indistinguishable, wherein the programming the first and second OTP elements occur after the selecting one of two different logic states as the selected logic state; and
determining if the first bitcell has the selected logic state, wherein the determining comprises determining if the first OTP element has a lower resistance than the second OTP element.

2. The method of claim 1, wherein the determining if the first OTP element has a lower resistance than the second OTP element comprises determining if the first OTP element has a lower resistance than the second OTP element by a margin.

3. The method of claim 1, wherein:
the first set of conditions and the second set of conditions include programming time;
the programming time is different between the first and second sets of conditions; and
the first set of conditions and the second set of conditions are for causing electromigration.

4. The method of claim 1 wherein the first set of conditions includes a first programming voltage applied to a terminal of the first OTP element and the second set of conditions includes a second programming voltage applied to a terminal of the second OTP element, wherein the first programming voltage supplies a different voltage level than the second programming voltage.

5. A method of programming a memory, comprising:
selecting one of two different logic states as a selected logic state for programming a first bitcell of the memory, wherein the first bitcell includes a first one-time-programmable (OTP) element and a second OTP element, and a logic state of the first bitcell is based on a difference between resistances of the first and second OTP element after providing a programming current through the first and second OTP elements;
programming a first one-time-programmable (OTP) element of the first bitcell using a first set of conditions to provide a first programming current through the first OTP element intended to achieve a first target resistance in accordance with the selected logic state which results in a first degree of programming of the first OTP element;
programming a second OTP element of the first bitcell using a second set of conditions different from the first set of conditions to provide a first second programming current through the second OTP element intended to achieve a second target resistance in accordance with the selected logic state which results in a second degree of programming of the second OTP element, wherein the first and second degrees of programming are visually indistinguishable, wherein the programming the first and second OTP elements occur after the selecting one of two different logic states as the selected logic state;
determining if the first bitcell has the selected logic state;
if the first bitcell does not have the selected logic state:
programming a redundant bitcell to the selected logic state, and
replacing the first bitcell with the redundant bitcell.

6. The method of claim 5 wherein the determining comprises determining if the first OTP element has a lower resistance than the second OTP element.

7. The method of claim 5, wherein the programming the redundant bitcell comprises:
programming a first OTP element of the redundant bitcell using the first set of conditions which results in a third degree of programming; and
programming a second OTP element of the redundant bitcell using the second set of conditions which results in a fourth degree of programming, wherein the third and fourth degrees of programming are visually indistinguishable.

8. The method of claim 7, further comprising determining if the redundant bitcell has the selected logic state.

9. The method of claim 8, wherein the determining if the redundant bitcell has the selected logic state comprises determining if the third OTP element has a lower resistance than the fourth OTP element by a sufficient margin.

10. The method of claim 8, further comprising: if the redundant bitcell does not have the selected logic state, using error correction coding during reading of the memory.

11. A memory comprising:
a bitcell array comprising a bitcell array of bitcells and a plurality of redundant bitcells, wherein:
each bitcell comprises a first one-time-programmable (OTP) element and a second OTP element and each redundant bitcell comprises a third OTP element and a fourth OTP element;
programming of the first, second, third, and fourth OTP elements causes a visible change with a resulting appearance; and
the resulting appearance from the programming does not indicate a degree of programming if the programming is within a predetermined range of programming conditions; and
programming circuitry coupled to the bitcell array that programs a selected bitcell to a selected state by programming the first OTP element of the selected bitcell with a first programming current using a first set of conditions that are within the predetermined range of programming conditions when the first set of conditions corresponds to the selected state and by programming the second OTP element of the selected bitcell with a second programming current using a second set of conditions that are different from the first set of conditions and are within the predetermined range, wherein the selected state is a particular logic state selected from two different logic states and selected prior to providing the first and second programming currents through the first and second OTP elements, wherein the programming circuitry determines if the selected bitcell has been programmed to the selected state by determining if a resistance of the first OTP element of the selected bitcell is greater than a resistance of the second OTP element of the selected bitcell.

12. The memory of claim 11, wherein, if the programming circuitry determines that the selected bitcell has not been programmed to the selected state, the programming circuitry programs a selected redundant bitcell by programming the third OTP element of the selected redundant bitcell using the first set of conditions and the fourth OTP element of the selected redundant bitcell using the second set of conditions.

13. The memory of claim 12, wherein if the program circuitry determines that the redundant bitcell has the selected state, the program circuitry replaces the selected bitcell with the redundant bitcell.

14. The memory of claim 13, further comprising:
sensing circuitry, coupled to the memory array, that performs reads of the memory array during a read mode; and
error correction code circuitry coupled to the sensing circuitry that corrects an output that corresponds to the selected bitcell when the selected bitcell and the selected redundant bitcell have not been programmed to the selected state.

15. The memory of claim 11, wherein the first set of conditions and the second set of conditions includes programming voltage and programming time, and the programming voltage in the first set of conditions supplies a voltage level to a first terminal of the first OTP element that is different from a voltage level supplied by the programming voltage in the second set of conditions to a first terminal of the second OTP element.

16. The memory of claim 11, wherein the programming by the programming circuitry is by electromigration.

17. A method of programming a memory having a plurality of bitcells, wherein each bitcell comprises a first one-time-programmable (OTP) element and a second OTP element, comprising:
determining a selected bitcell for programming to a selected logic state, wherein the selected logic state is a particular logic state selected from two different logic states, and a logic state of the first bitcell is based on a difference between resistances of the first and second OTP element after providing a programming current through the first and second OTP elements; and
programming the selected bitcell to the selected logic state by applying a first set of conditions to the first OTP element of the selected bitcell to provide a first programming current to the first OTP element to result in a first resistance in the first OTP element and applying a second set of conditions different from the first set of conditions to the second OTP element of the selected bitcell to provide a second programming current to the second OTP element to result in a second resistance in the second OTP element greater than the first resistance, wherein:
the first OTP element changes to a first visible appearance indicative of a resistance in a first range of resistance,
the second OTP element changes to a second visible appearance indicative of a resistance in the first range, and
a comparison of the first visible appearance and the second visible appearance cannot reliably identify which of the first and second OTP elements has the greater resistance; and
determining if the first bitcell has the selected logic state by determining if the first OTP element has a lower resistance than the second OTP element.

18. The method of claim 17, wherein programming causes electromigration to result in the first resistance, the second resistance, the first visible appearance, and the second visible appearance.

* * * * *